(12) United States Patent
Cheng

(10) Patent No.: US 10,056,397 B2
(45) Date of Patent: Aug. 21, 2018

(54) INTEGRATED CIRCUIT AND METHOD FOR MANUFACTURING THEREOF

(71) Applicant: UNITED MICROELECTRONICS CORP., Hsin-Chu (TW)

(72) Inventor: Chao-Sheng Cheng, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/892,387

(22) Filed: Feb. 8, 2018

(65) Prior Publication Data

US 2018/0166455 A1 Jun. 14, 2018

Related U.S. Application Data

(62) Division of application No. 15/232,833, filed on Aug. 10, 2016, now Pat. No. 9,929,164.

(30) Foreign Application Priority Data

Jul. 6, 2016 (CN) .......................... 2016 1 0528411

(51) Int. Cl.

| | |
|---|---|
| *H01L 29/788* | (2006.01) |
| *H01L 27/11521* | (2017.01) |
| *H01L 21/306* | (2006.01) |
| *H01L 21/28* | (2006.01) |
| *H01L 27/11534* | (2017.01) |
| *H01L 29/423* | (2006.01) |
| *H01L 29/66* | (2006.01) |
| *H01L 23/528* | (2006.01) |

(52) U.S. Cl.
CPC .. *H01L 27/11521* (2013.01); *H01L 21/28273* (2013.01); *H01L 21/30604* (2013.01); *H01L 21/30625* (2013.01); *H01L 23/528* (2013.01); *H01L 27/11534* (2013.01); *H01L 29/42328* (2013.01); *H01L 29/66545* (2013.01)

(58) Field of Classification Search
CPC ......... H01L 21/28273; H01L 21/30604; H01L 21/30625; H01L 27/11521
See application file for complete search history.

(56) References Cited

U.S. PATENT DOCUMENTS

| 6,706,602 B2 * | 3/2004 | Hsu .................... H01L 21/28273 257/315 |
| 2014/0151782 A1 * | 6/2014 | Tsair .................... H01L 29/7881 257/320 |

(Continued)

*Primary Examiner* — Mark Tornow
(74) *Attorney, Agent, or Firm* — Winston Hsu

(57) ABSTRACT

A method for manufacturing an integrated circuit includes following steps. A substrate including a memory region and a core region is provided. At least two semiconductor word lines, two memory cells in between the two semiconductor word lines, and a semiconductor gate in between the two memory cells are formed in the memory region. A transistor device including a dummy gate is formed in the core region, and a height of the dummy gate is larger than a height of the semiconductor word lines. A protecting layer is formed on the semiconductor word lines, the memory cells, the semiconductor gate and the transistor device. A portion of the protecting layer is removed to expose the dummy gate and followed be removing the dummy gate to form a gate trench in the transistor device. Then a metal gate is formed in the gate trench.

11 Claims, 10 Drawing Sheets

(56) References Cited

U.S. PATENT DOCUMENTS

2015/0187783 A1    7/2015  Chuang
2016/0013198 A1*   1/2016  Liu .................. H01L 27/11524
                                                             257/322
2016/0027792 A1*   1/2016  Zhang ............... H01L 27/11521
                                                             257/321

* cited by examiner

US 10,056,397 B2

INTEGRATED CIRCUIT AND METHOD FOR MANUFACTURING THEREOF

CROSS REFERENCE TO RELATED APPLICATIONS

This application is a division of U.S. application Ser. No. 15/232,833 filed Aug. 10, 2016, and incorporated herein by reference in its entirety.

BACKGROUND OF THE INVENTION

1. Field of the Invention

The invention relates to an integrated circuit (IC) and a method for manufacturing the same, and more particularly, to an integrated circuit structure including flash memory and a method for manufacturing the same.

2. Description of the Prior Art

Memory devices are typically provided as internal storage areas in the computer. The term memory identifies data storage that comes in the form of integrated circuit chips. There are several different types of memory. For example, non-volatile is a type of memory that retains information even when no power is supplied to memory blocks thereof. Examples of non-volatile memory devices include read-only memory (ROM), magnetic computer storage devices (e.g., hard disks, floppy disk drives), optical disc drives, erasable programmable read-only memory (EPROM), electrically erasable programmable read-only memory (EEPROM), and flash memory. Flash memory, like EEPROM, can also be electrically erased and programmed.

Recent flash memory applications include "embedded flash memory" is to integrate the flash memory with peripheral/core circuitry on a single chip or integrated circuit. However, it is well-known that device configurations of the memory cells in the memory block and devices in peripheral/core circuitry are not always the same. Therefore, the embedded flash memory unavoidably increases process complexity and process difficulty. The embedded flash memory technique even causes difficulty in integration.

SUMMARY OF THE INVENTION

According to an aspect of the present invention, a method for manufacturing an integrated circuit structure is provided. The method includes following steps. A substrate including a memory region and a core region defined thereon is provided and followed by forming at least two semiconductor word lines, two memory cells and a semiconductor gate in the memory region. The memory cells are formed in between the two semiconductor word lines, and the semiconductor gate are formed in between the two memory cells. The semiconductor word lines include a first height. Next, at least a transistor device is formed in the core region. The transistor device includes a dummy gate, and the dummy gate includes a second height larger than the first height. After forming the transistor device, a protecting layer is formed on the semiconductor word lines, the memory cells, the semiconductor gate and the transistor device. Then, a portion of the protecting layer is removed to expose the dummy gate of the transistor device. The semiconductor word lines and the semiconductor gate are still covered by the protecting layer. Subsequently, the dummy gate is removed to form a gate trench in the transistor device. And a metal gate is then formed in the gate trench.

According to an aspect of the present invention, an integrated circuit structure is provided. The integrated circuit structure includes a substrate having a memory region and a core region defined, two semiconductor word lines disposed in the memory region, two memory cells disposed in between the two semiconductor word lines in the memory region, a semiconductor gate disposed in between the two memory cells in the memory region, and at least a transistor device disposed in the core region. The transistor device includes a metal gate, and a height of the metal gate is equal to or larger than a height of the semiconductor word lines and a height of the semiconductor gate.

According to the method for manufacturing the integrated circuit structure provided by the present invention, the semiconductor word lines having the height smaller than the height of the dummy gate is provided. That is, a height difference is caused between the dummy gate and the semiconductor word lines. Accordingly, the semiconductor word lines are protected by the height difference and the protecting layer during removing the dummy gate. More important, the semiconductor word lines are protected without introducing any extra photomask. In other words, the integrated circuit structure and the method for manufacturing the same provided by the present invention is to construct different devices in the memory region and in the core region without increasing process complexity and difficulty, and thus it improves semiconductor integration processes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a method for manufacturing an integrated circuit structure provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

Figure 1:
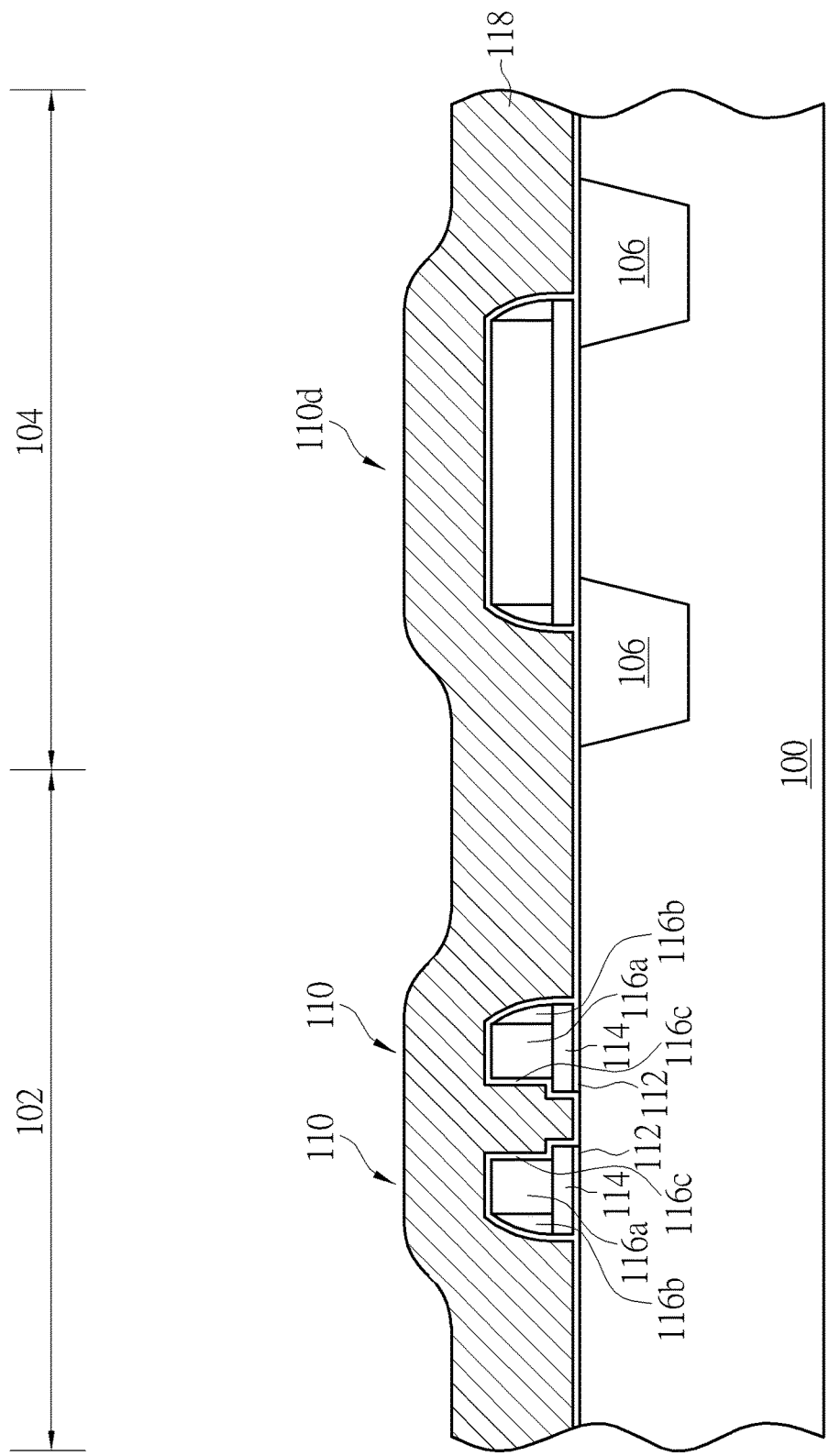

Please refer to FIGS. 1-8, which are schematic drawings illustrating a method for manufacturing an integrated circuit structure provided by a preferred embodiment of the present invention. As shown in FIG. 1, a substrate 100 such as a silicon substrate, silicon-containing substrate or silicon-oninsulator (hereinafter abbreviated as SOI) substrate is provided. In the embodiments of the present invention, a memory region 102 and a core region 104 are defined on the substrate 100, and a plurality of isolation structures 106 are formed in the substrate 100. The isolation structures 106 are used to define active region(s) for accommodating p-typed FET device(s) and/or n-typed FET device(s), and to provide electrical isolations. The isolation structures 160 can include shallow trench isolations (STIs), but not limited to this.

Please still refer to FIG. 1. Next, at least two memory cells 110 are formed in the memory region 102. In some embodiments of the present invention, the memory cells 110 can be formed by the following step. A dielectric layer 112 and a conductive 114 are formed on the substrate 100. The conductive layer 114 can be a polysilicon layer and the dielectric layer 112 can be a silicon oxide (SiO) layer in some embodiments of the present invention, but not limited to this. Next, a plurality of patterned hard masks 116a/116b are formed in the memory region 102 and the core region 104, respectively. In some embodiment of the present invention, the patterned hard masks merely include a silicon nitride (SiN) hard mask 116a. In other embodiments the present invention, the patterned hard masks respectively include a SiN hard mask 116a and a SiO spacer 116b formed on sidewalls of the SiN hard mask 116a. Subsequently, the conductive layer 114 and the dielectric layer 112 are etched through the patterned hard masks 116a/116b, and thus at least two memory cells 110 are formed in the memory region 102, as shown in FIG. 1. Furthermore, at least a dummy gate stack 110d is selectively formed in the core region 104. However, those skilled in the art would easily realize that the dummy gate stack 110d is formed depending on different product or process requirements, and therefore the memory cells 110 and the dummy gate stack 110d can be formed by different processes.

Please still refer to FIG. 1. Next, a semiconductor layer 118, such as a polysilicon layer, is formed on the substrate 100. It is noteworthy that before forming the polysilicon layer 118, a portion of the SiO spacers 116b, particularly the portion of the SiO spacers 116b on the sides of the memory cells 110 that face each other, are removed. And a tunneling oxide layer 116c is subsequently formed. As shown in FIG. 1, the tunneling oxide layer 116c covers at least the sidewalls of the conductive layer 114 and the substrate 100 between the two memory cells 110. After forming the tunneling oxide layer 116c, the semiconductor layer 118 is formed. As shown in FIG. 1, vacancies between the memory cells 110 are filled up with the semiconductor layer 118.

Figure 2:
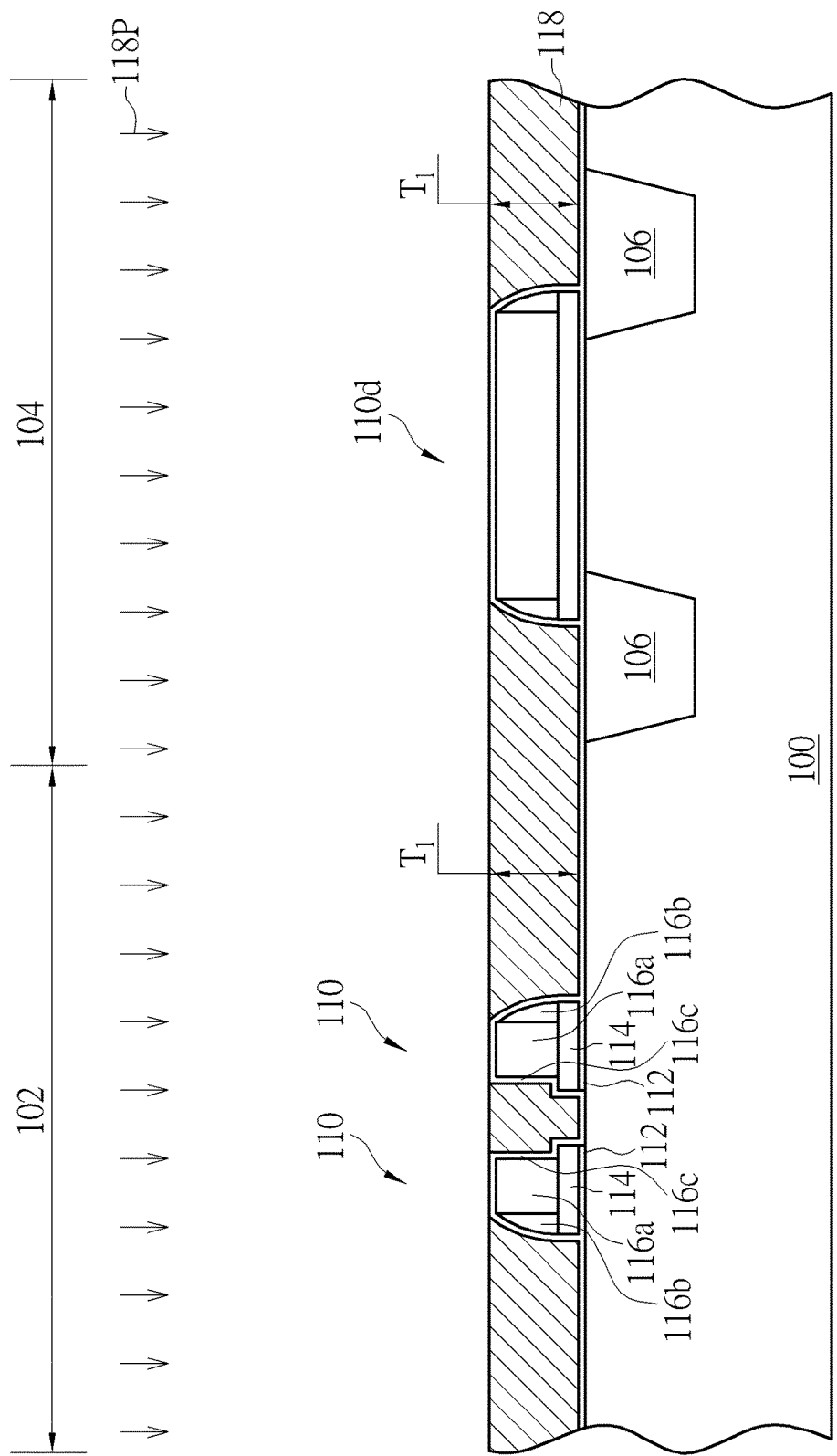

Please refer to FIG. 2. After forming the semiconductor layer 118, a planarization process 118P is performed to planarize the semiconductor layer 118. Consequently, a top surface of the semiconductor layer 118 is coplanar with atop surface of each memory cell 110 and a top surface of the dummy gate stack 110d. As shown in FIG. 2, the semiconductor layer 118 includes a first thickness T1 after the planarization process 118P.

Figure 3:
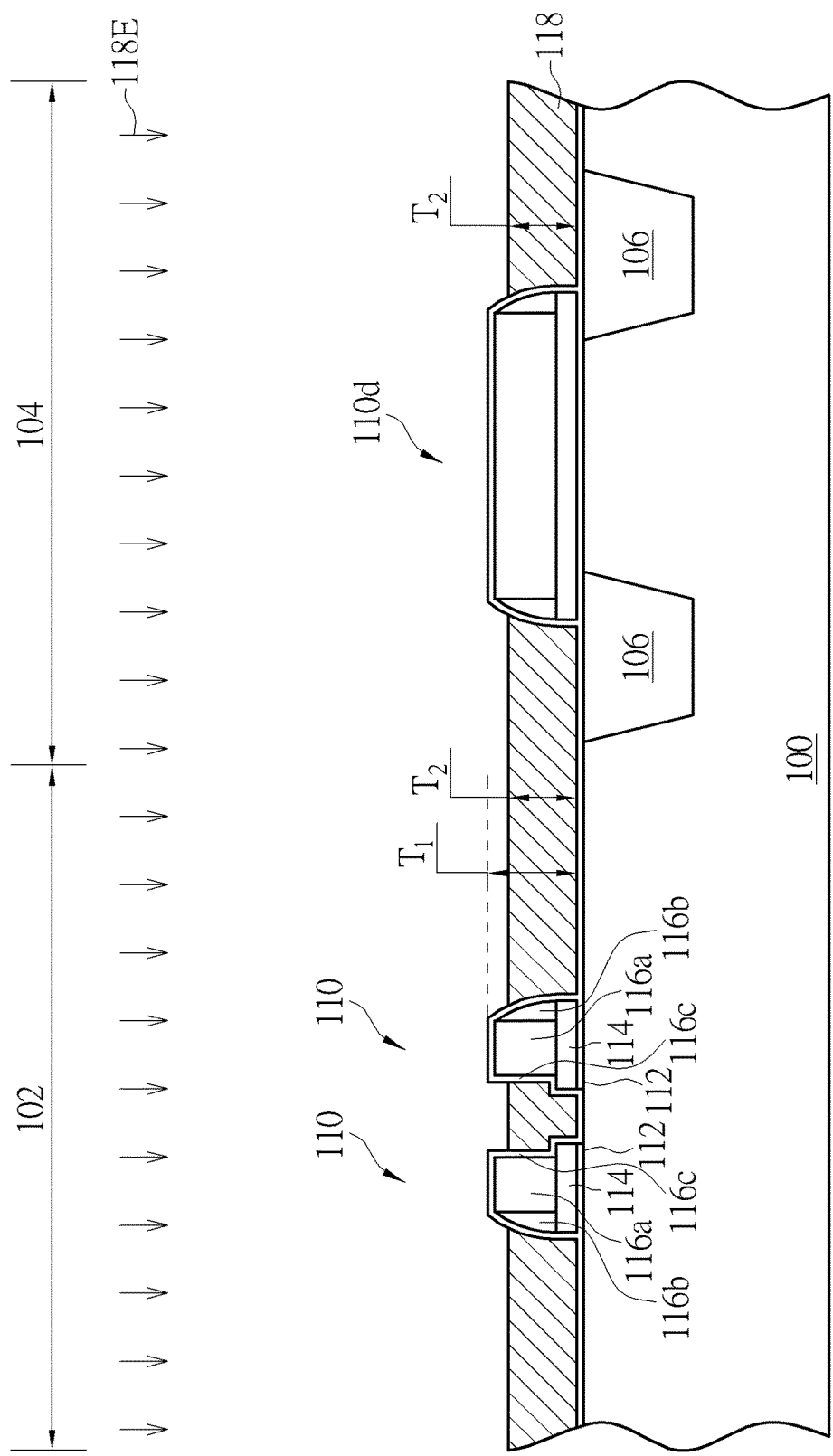

Please refer to FIG. 3. Next, an etching back process 118E is performed to etch back the semiconductor layer 118. Consequently, the top surface of the semiconductor layer 118 is lower than the top surface of the memory cells 110. As shown in FIG. 3, the semiconductor layer 118 includes a second thickness T2 after the etching back process 118E. It is noteworthy that the first thickness T1 of the semiconductor layer 118 before the etching back process 118E is depicted in FIG. 3. Therefore difference between the first thickness T1 before the etching back process 118E and the second thickness T2 after the etching back process 118E is easily obtained. As shown in FIG. 3, a height difference between the first thickness T1 and the second thickness T2 is between 170 angstroms (Å) and 250 Å, but not limited to this.

Figure 4:
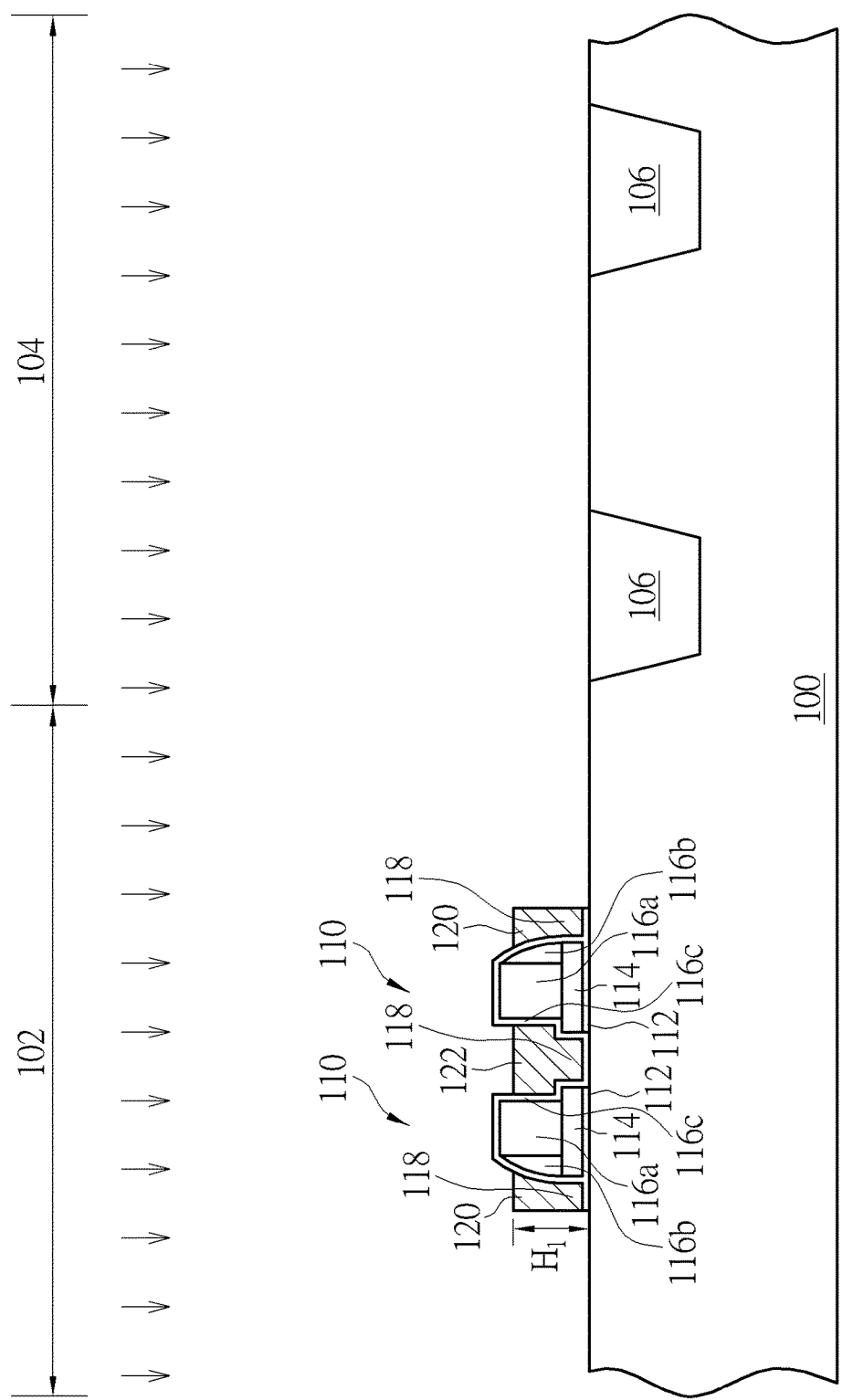

Please refer to FIG. 4. After performing the etching back process 118E, a patterned protecting layer (not shown) is formed in the memory region 102. The patterned protecting layer is formed to cover and protect portions of the semiconductor layer 118 around the memory cells 110. Subsequently, portions of the semiconductor layer 118 not covered by the patterned protecting layer are removed from the substrate 100. Consequently, two semiconductor word lines 120 are formed in the memory cell region 102, and a semiconductor gate 122 is simultaneously formed in between the two memory cells 110 in the memory cell region 102. As shown in FIG. 4, the two memory cells 110 are therefore disposed in between the two semiconductor word lines 120, and the semiconductor gate 122 is disposed in between the two memory cells 110. It is noteworthy that the semiconductor word lines 120 and the semiconductor gate 122 respectively includes a height H1, and the height H1 is a sum of a thickness of tunneling oxide layer 116c and second thickness T2 of the semiconductor layer 118. It is also noteworthy that simultaneously with removing the portions of the semiconductor layer 118 to form the semiconductor word lines 120 and the semiconductor gate 122, all layers on the substrate 100 in the core region 104 are removed. Accordingly, the substrate 100 in the core region 104 is exposed as shown in FIG. 4.

Figure 5:
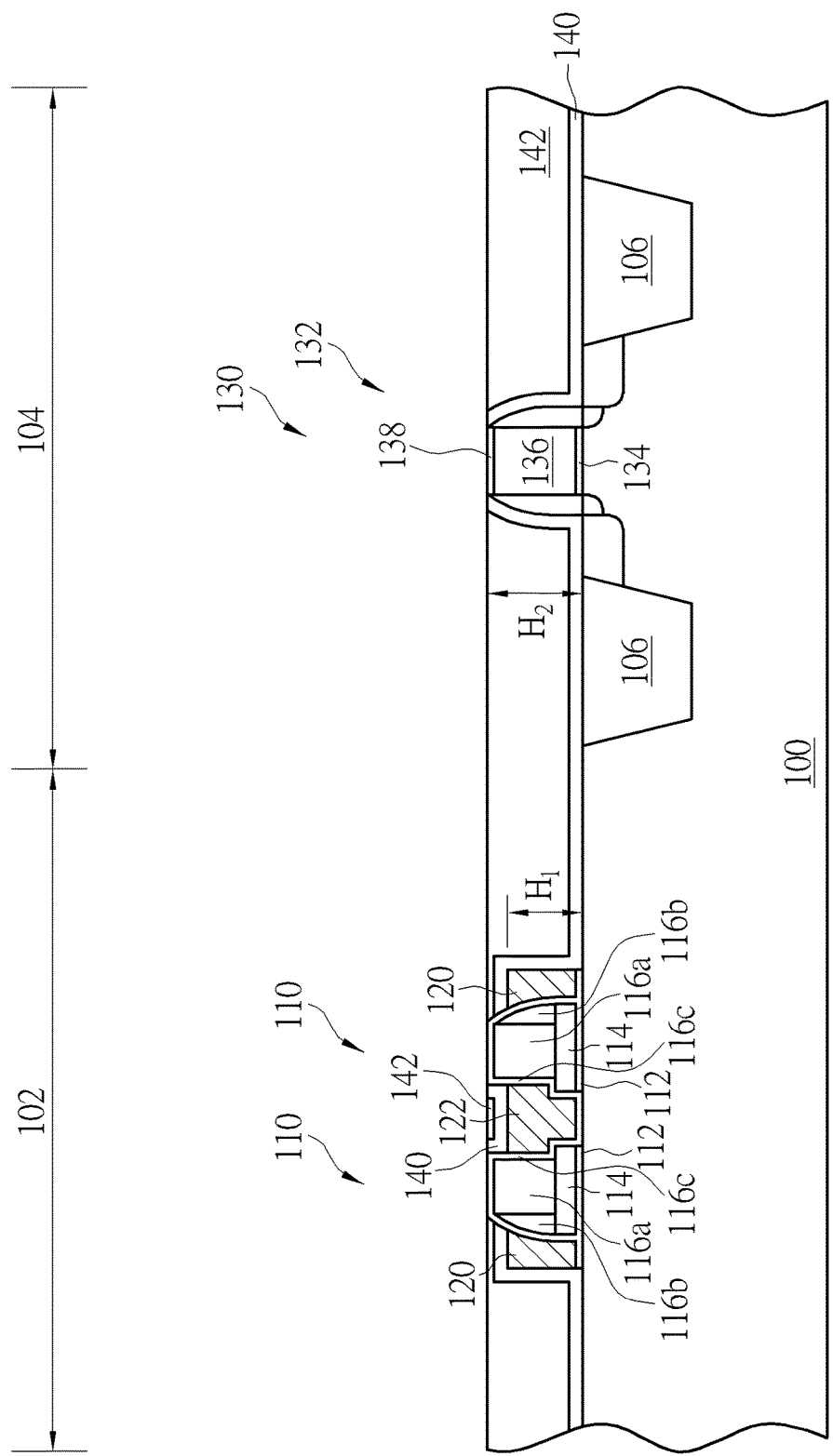

Please refer to FIG. 5. Next, at least a transistor device 130 is formed in the core region 104. In the preferred embodiment, the transistor device 130 includes a dummy gate 132, and the dummy gate 132 includes a gate dielectric layer 134, a semiconductor layer 136 and a patterned hard mask 138. It should be easily realized by those skilled in the art that the transistor device 130 further includes other elements such as lightly-doped drains (LDDs) and source/drain that are formed in the substrate 100, and spacer formed on sidewalls of the dummy gate 132. In some embodiments of the present invention, selective strain scheme (SSS) can be used in the preferred embodiment. For example, a selective epitaxial growth (SEG) method can be used to form the source/drain. When the transistor device 130 is an n-typed transistor device, epitaxial silicon layers of SiC or SiP are used to form the source/drain. When the transistor device 130 is a p-typed transistor device, epitaxial silicon layers of SiGe are used to form the source/drain. Furthermore, salicide (not shown) can be formed on the surfaces of the source/drain so that contact resistance between the source/drain and contact plugs to be formed is reduced. It should be easily understood that devices formed in the core region 104 can construct peripheral circuitry, and the peripheral circuitry may include high voltage circuits, logic circuits for microcontrollers or processors. And other types of devices such as diodes, band-gap devices, capacitors, inductors, and linear devices can be formed in the core region 104. After forming the transistor device 130, an etch liner such as a contact etch stop layer (hereinafter abbreviated as CESL) 140 is formed on the substrate 100. The CESL 140 covers sidewalls and tops of the semiconductor word lines 120, a top of the semiconductor gate 122, and a top and sidewalls of the transistor device 130. An interlayer dielectric (hereinafter abbreviated as ILD) layer 142 is subsequently formed on the substrate 100. It is noteworthy that the ILD layer 142 and the CESL 140 serve as not only isolation structure and etch stop layer, but also serve as a protecting layer in the embodiments of the present invention. In other words, the embodiments of the present invention provide a protecting layer 140/142 formed on the semiconductor word lines 120, the memory cells 110, the semiconductor gate 122, and the transistor device 130.

Please still refer to FIG. 5. After forming the ILD layer 142, a planarization process is performed to remove superfluous ILD layer 142 and CESL 140. Consequently, the patterned hard mask 138 of the dummy gate 132 is exposed as shown in FIG. 5. It is noteworthy that the dummy gate 132 includes a second height H2, and the second height H2 of the dummy gate 132 is larger than the first height H1 of the semiconductor word lines 120 and the semiconductor gate 122 in every embodiments of the present invention. Therefore, the shorter semiconductor word lines 120 and semiconductor gate 122 are always covered by the protecting layer 140/142 and impervious to the planarization which is performed to expose the patterned hard mask 138 on the dummy gate 132.

Figure 6:
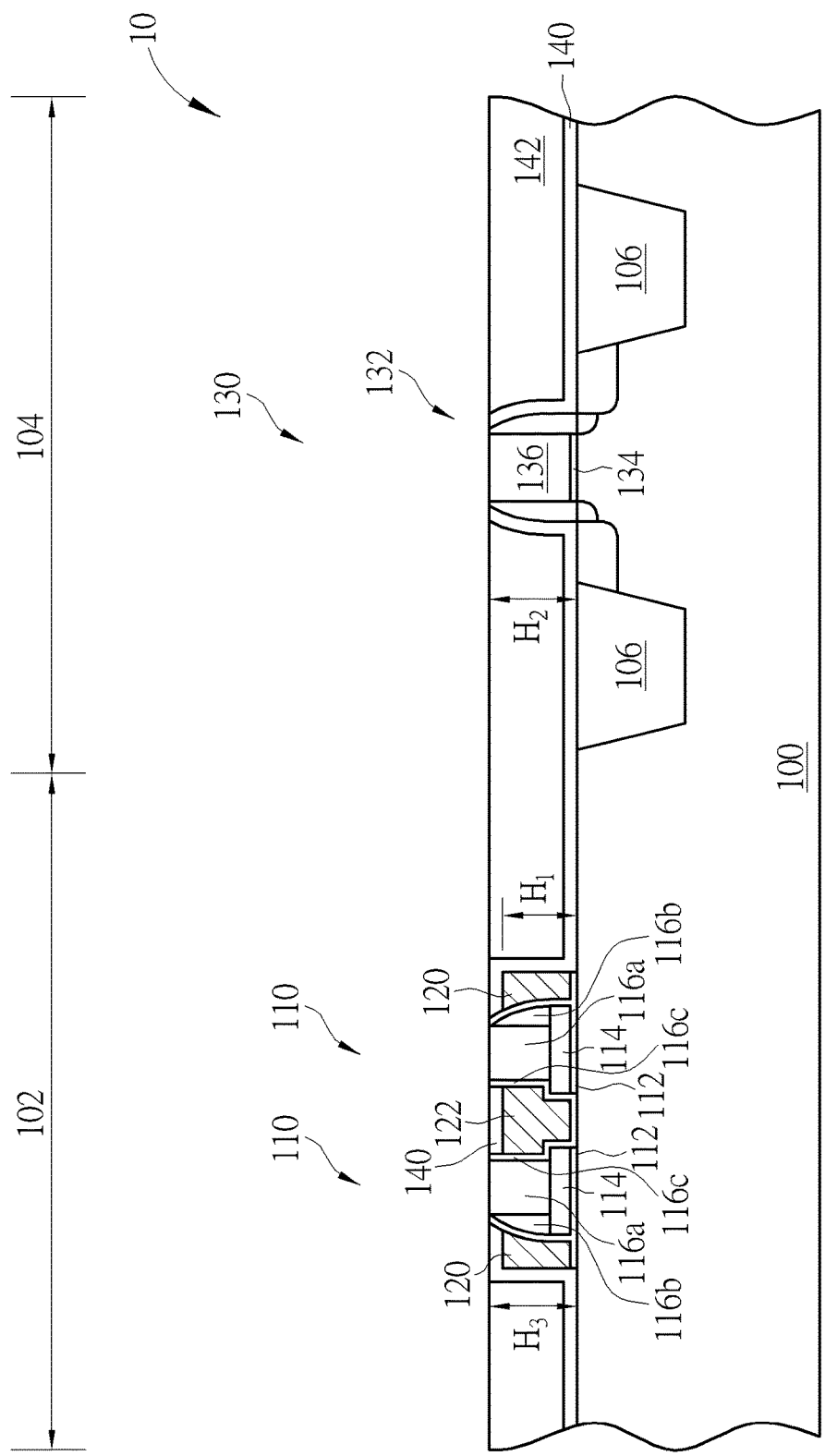

Please refer to FIG. 6. Next, an etching process is performed to remove the patterned hard mask 138 of the dummy gate 132, and thus the semiconductor layer 134 of the dummy gate 132 is exposed. As shown in FIG. 6, the ILD layer 142, the CESL 140 and the patterned hard mask 116a/116b in the memory cells 110 may be consumed and thus a height of the memory cells 110 may be reduced. In some preferred embodiments of the present invention, the height H3 of the memory cells 110 may be equal to the height H2 of the dummy gate 132, but not limited to this. It is noteworthy that since the height H2 of the dummy gate 132 is larger than the height H1 of the semiconductor word lines 120 and the semiconductor gate 122, the shorter the semiconductor word lines 120 and the semiconductor gate 122 are still covered by the protecting layer 142 and/or 140 during the etching process, and the profile of the semiconductor word lines 120 and the semiconductor gate 122 are still impervious to the etching process.

Figure 7:
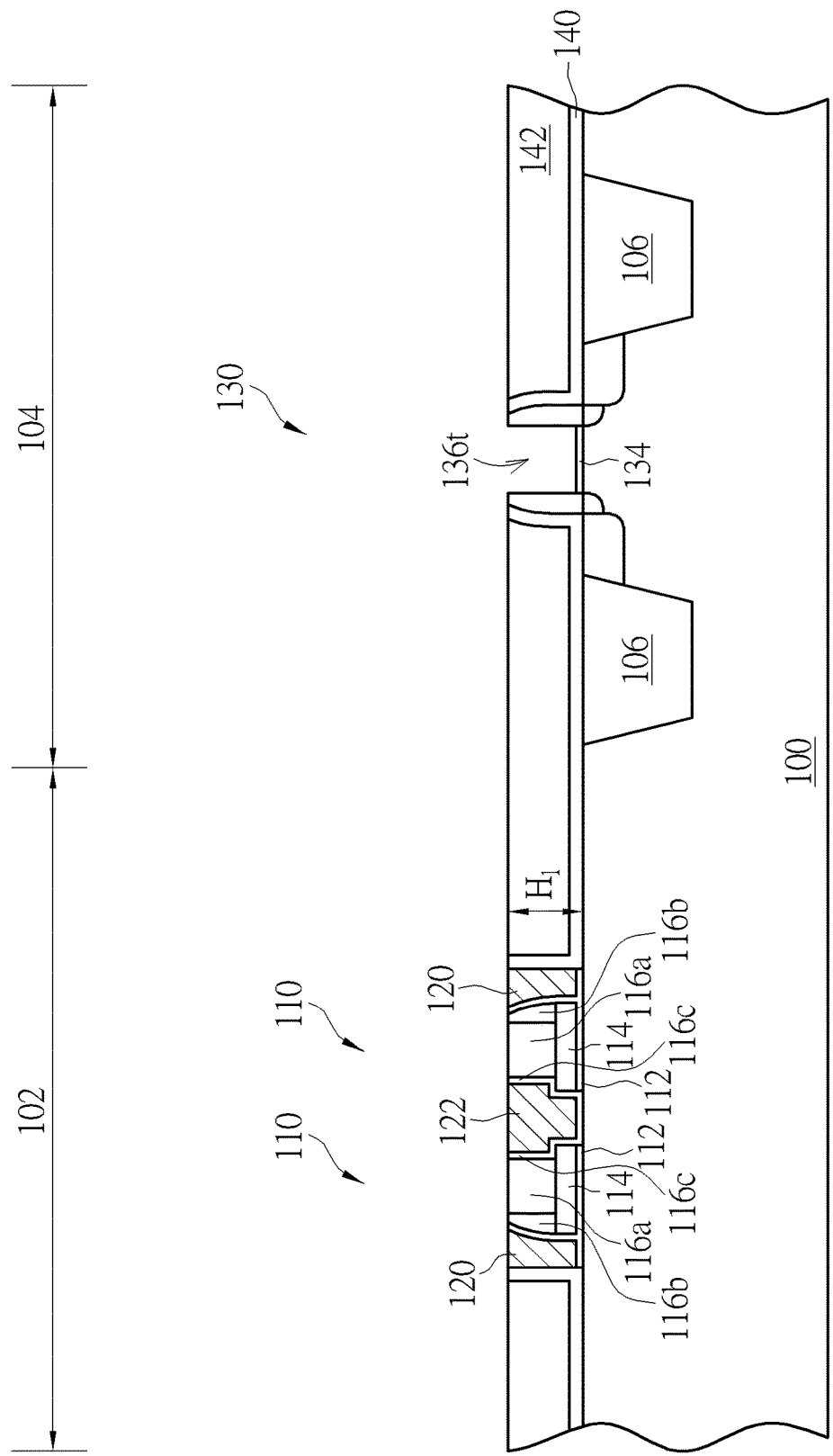

Please refer to FIG. 7. Next, the semiconductor layer 136 of the dummy gate 132 is removed to form a gate trench 136t in the transistor device 130. In the preferred embodiments of the present invention, the gate dielectric layer 134 preferably is a high-k gate dielectric layer. The high-k gate dielectric layer 134 can include high-k material selected from the group consisting of silicon nitride (SiN), silicon oxynitride (SiON) and metal oxide. And the metal oxide can include hafnium oxide (HfO), hafnium silicon oxide (HfSiO), hafnium silicon oxynitride (HfSiON) , aluminum oxide (AlO), lanthanum oxide (LaO), lanthanum aluminum oxide (LaAlO), tantalum oxide (TaO), zirconium oxide (ZrO), strontium zirconium silicon oxide (ZrSiO), or hafnium zirconium oxide (HfZrO), but not limited to this. It is noteworthy that in some embodiments of the present invention, high-k first approach is adopted, and thus the high-k gate dielectric layer 134 includes a flap shape and is exposed at a bottom of the gate trench 136t, as shown in FIG. 7. Alternatively, in other embodiments of the present invention, high-k last approach is adopted. In the high-k last approach, the dielectric layer 134 exposed at the bottom of the gate trench 136t serves as an interfacial layer (IL), and the interfacial layer provides a superior interface between the substrate 100 and the high-k gate dielectric layer (not shown) following formed.

Figure 8:
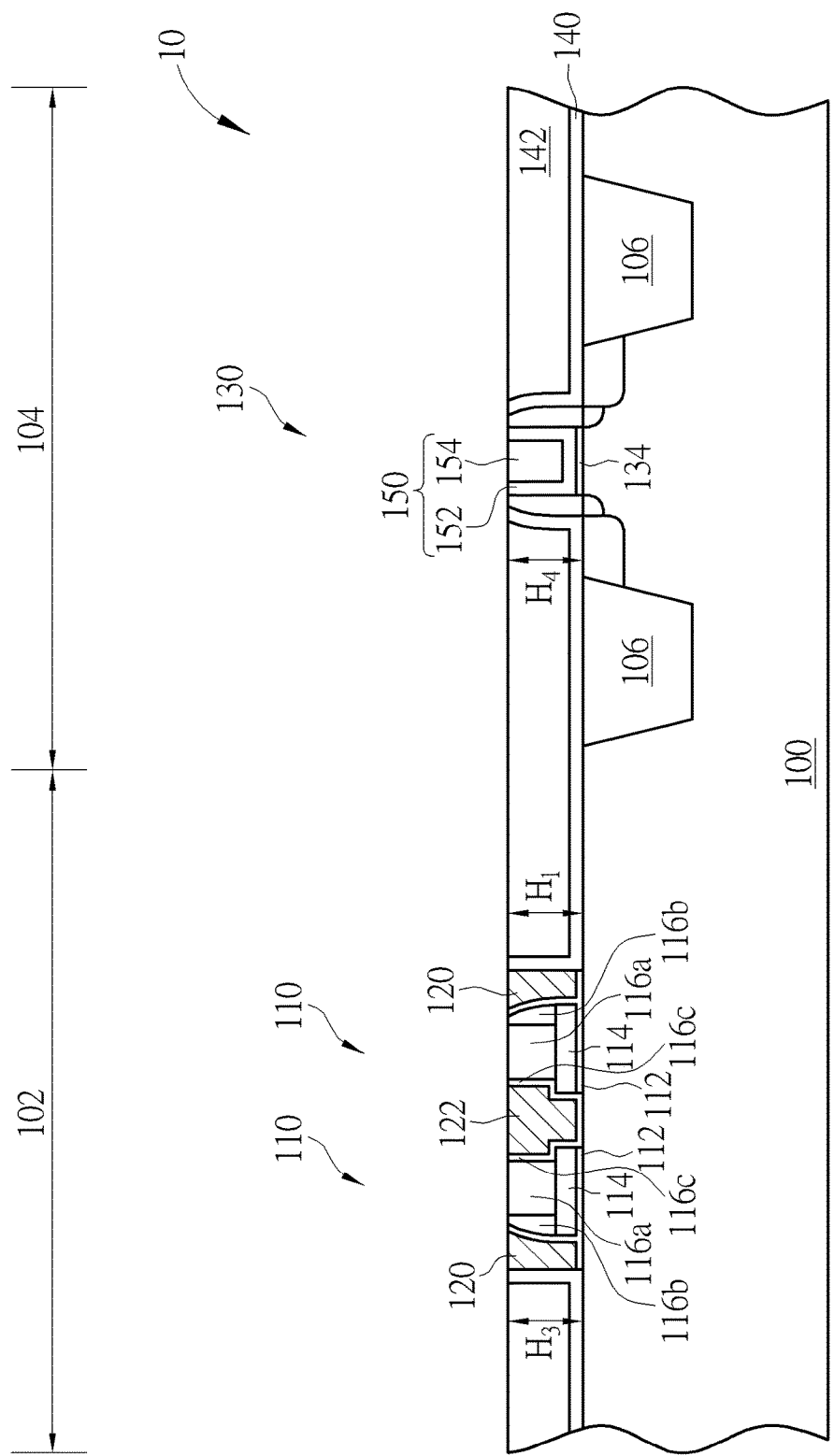

Please still refer to FIG. 8. After forming the gate trench 136t or the high-k gate dielectric layer, at least a work function metal layer 152 and a filling metal layer 154 are sequentially formed on the high-k gate dielectric layer 134 in the gate trench 136t. In some embodiment of the present invention, when the transistor device 130 is the p-typed transistor, the work function metal layer 152 is a p-typed work function metal layer and exemplarily includes TiN, TaN, titanium carbide (TiC), tantalum carbide (TaC), tungsten carbide (WC), or aluminum titanium nitride (TiAlN), but not limited to this. It should be easily realized that when the transistor device 130 is a p-typed transistor, the work function metal layer 152 can include any suitable metal material having a work function between about 4.8 eV and about 5.2 eV. Alternatively, in other embodiments of the present invention, when the transistor device 130 is the n-typed transistor, the work function metal layer 152 is an n-typed work function metal layer such as titanium aluminide (TiAl), zirconium aluminide (ZrAl), tungsten aluminide (WAl), tantalum aluminide (TaAl), or hafnium aluminide (HfAl), but not limited to this. As mentioned above, when the transistor device 130 is the n-typed transistor, the work function metal layer 152 can include any suitable metal materials having a work function between about 3.9 eV and about 4.3 eV. In addition, the work function metal layer 152 can be a single-layered structure or a multi-layered structure. The filling metal layer 154 includes materials with low resistance and superior gap-filling characteristic, the materials can be selected from the group consisting of Al, Ti, Ta, W, Nb, Mo, Cu, TiN, TiC, TaN, Ti/W and Ti/TiN, but not limited to this. Furthermore, metal layers such as a bottom barrier layer (not shown), an etch stop layer (not shown), and/or a top barrier layer (not shown) can be formed if required.

Please refer to FIG. 8. After forming the filling metal layer 154, a planarization process is performed to remove superfluous work function metal layer 152 and filling metal layer 154, and thus a metal gate 150 is formed in the gate trench 136t. It is noteworthy that the metal gate 150 includes a height H4, and the height H4 of the metal gate 150 is equal to or larger than the height H1 of the semiconductor word lines 120 and the semiconductor gate 122. As shown in FIG. 8, the height H4 of the metal gate 150 is equal to the height H1 of the semiconductor word lines 120 and the semiconductor gate 122.

Please still refer to FIG. 8. Accordingly, the preferred embodiment provides an integrated circuit structure 10 including the substrate 100 having the memory region 102 and the core region 104 defined thereon, the two semiconductor word lines 120 disposed in the memory region 102, the two memory cells 110 disposed in between the two semiconductor word lines 120 in the memory region 102, the semiconductor gate 122 disposed in between the two memory cells 110 in the memory region 102, and at least the transistor device 130 disposed in the core region 104. In the preferred embodiment, the conductive layer 114 of each memory cell 110 serves as a floating gate, and the semiconductor gate 122 disposed in between the two memory cells 110 serves as an erase gate. As mentioned above, the height H4 of the metal gate 150 of the transistor device 130 is equal to the height H1 of the semiconductor word lines 120 and the semiconductor gate 122. As shown in FIG. 8, the height H3 of the memory cells 110 is equal to the height H4 of the metal gate 150, and thus the height H3 of the memory cells 110 is also equal to the height H1 of the semiconductor word lines 120 and the semiconductor gate 122. In other words, a bottom of the metal gate 150, a bottom of each memory cell 110, a bottom of the semiconductor gate 122, and a bottom of each semiconductor word line 120 are coplanar. And a top of the metal gate 150, a top of the semiconductor gate 122, a top of each memory cell 110, and a top of each semiconductor word lines 120 are also coplanar, as shown in FIG. 8.

Those skilled in the art would easily realize, that elements such as contact plugs (not shown) can be formed after obtaining the integrated circuit structure 10, therefore electrical connections between the semiconductor word lines 120, the semiconductor gate 122, the transistor device 130, and other devices/circuitry are constructed. Accordingly, the protecting layer 140/142 may be removed to expose at least a portion of the semiconductor gate 122 and the semiconductor word lines 120 so that the contact plugs can be landed on. In that circumstance, sidewalls of the semiconductor word lines 120 and sidewalls of the metal gate 150 are still covered by the protecting layer, and at least a portion of the top of each semiconductor word line 120 and a portion of the top of the semiconductor gate 122 are still covered by the protecting layer 140/142.

Figure 9:
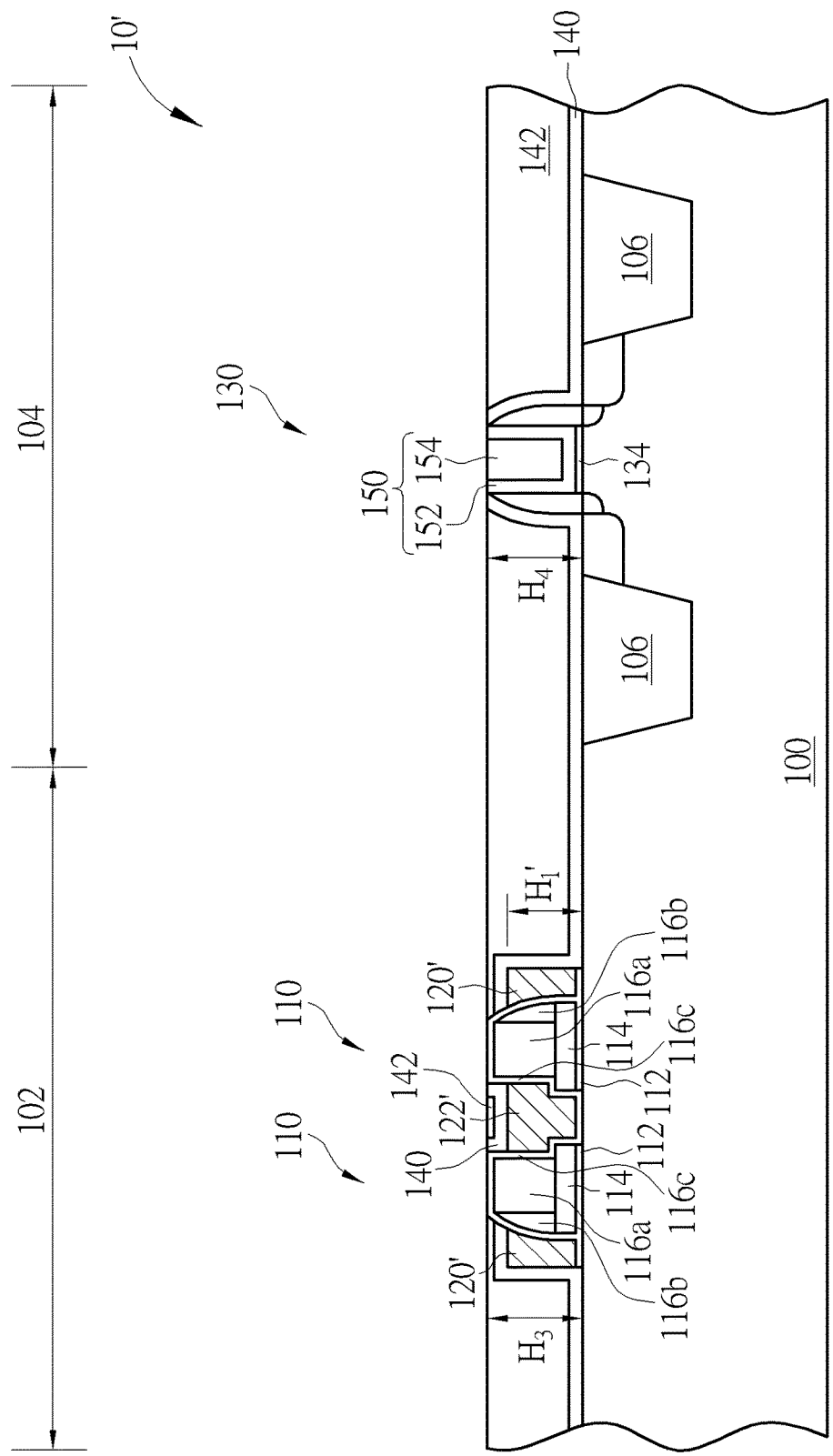
FIG. 9 is a schematic drawing illustrating a modification to the preferred embodiment.

Please refer to FIG. 9, which is a schematic drawing illustrating a modification to the preferred embodiment. According to the modification, parameters of the etching back process are modified or adjusted, therefore the height H1' of the semiconductor word lines 120' and the semiconductor gate 122' is smaller than the height H4 of the metal gate 150 and the height H3 of the memory cells 110. Consequently, in the integrated circuit structure 10' provided by the modification, the bottom of the metal gate 150, the bottoms of the memory cells 110, the bottom of the semiconductor gate 122', and the bottoms of the semiconductor word lines 120' are coplanar. However, the top of the semiconductor gate 122' and the tops of the semiconductor word lines 120' are lower than the top of the metal gate 150 and the top of the memory cells 110. In other words, the height H3 of the memory cells 110 and the height H4 the metal gate 150 are larger than the height H1' of the semiconductor word lines 120' and the semiconductor gate 122'. Additionally, as shown in FIG. 9, the height H3 of the memory cells 110 can be equal to the height H4 of the metal gate 150, but not limited to this.

Figure 10:
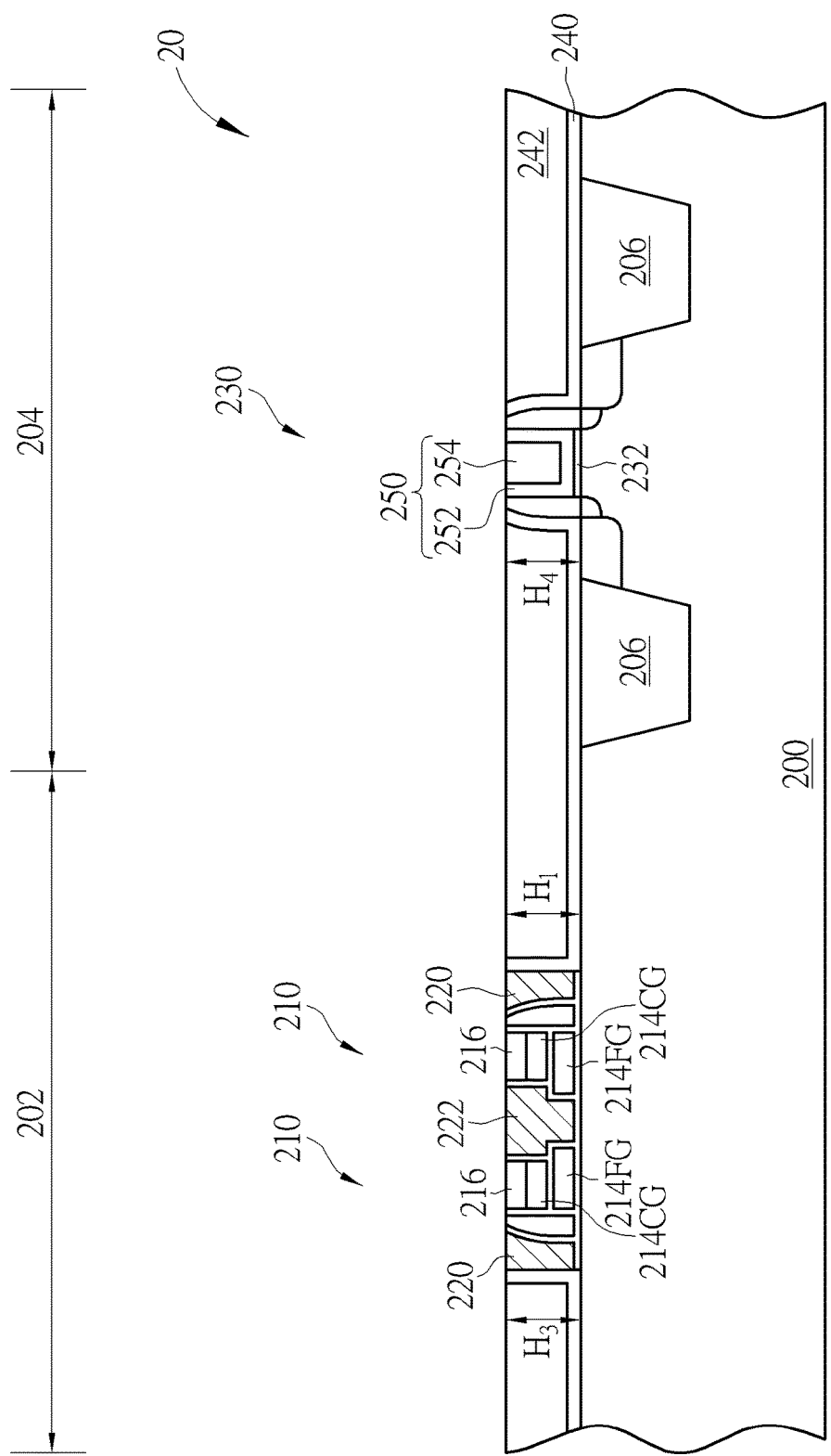
FIG. 10 is a schematic drawing illustrating an integrated circuit structure provided by another preferred embodiment of the present invention.

Please refer to FIG. 10, which is a schematic drawing illustrating an integrated circuit structure provided by another preferred embodiment of the present invention. As shown in FIG. 10, an integrated circuit structure 20 is provided. Steps for forming the integrated circuit structure 20 can be the same with those steps as mentioned above. Particularly, steps for forming the semiconductor word lines and the semiconductor gate are the same with those steps mentioned above, therefore those details are omitted in the interest of brevity. According to the preferred embodiment, a substrate 200 including a memory region 202 and a core region 204 is provided. And isolation structures 206 used to define active region(s) for accommodating p-typed transistor device(s) and/or n-typed FET device(s), and to provide electrical isolation are formed in the substrate 200. The integrated circuit structure 20 further includes two semiconductor word lines 220 disposed in the memory region 202, two memory cells 210 disposed in between the two the semiconductor word lines 220 in the memory region 202, a semiconductor gate 222 disposed in between the two the memory cells 210 in the memory region 202, and a transistor device 230 disposed in the core region 204. According to the preferred embodiment, the memory cells 210 respectively includes a floating gate 214FG, a patterned hard mask 216, and a control gate 214CG sandwiched in between the patterned hard mask 216 and the floating gate 214FG. And the semiconductor gate 222 disposed in between the two memory cells 210 serve as an erase gate. As shown in FIG. 10, the transistor device 230 includes a metal gate 250, and metal gate 250 includes at least a high-k gate dielectric layer 232, a work function metal layer 252, and a filling metal layer 254. The integrated circuit structure 20 further includes a CESL 240 and an ILD layer 242.

A height H4 of the metal gate 250 can be equal to or larger than a height H1 of the semiconductor word lines 220 and the semiconductor gate 222. And a height H3 of the memory cells 210 can be equal to or larger than a height H1 of the semiconductor word lines 220 and the semiconductor gate 222. Additionally, a height H3 of the memory cells 210 can be equal to the height H4 of the metal gate 250. In other words, a bottom of the metal gate 250, a bottom of each memory cell 210, a bottom of the semiconductor gate 222, and a bottom of each semiconductor word line 220 are coplanar, as shown in FIG. 10.

Please still refer to FIG. 10. Not only the bottom of the metal gate 250, the bottom of each memory cell 210, the bottom of the semiconductor gate 222, and the bottom of each semiconductor word line 220 are coplanar, but also a top of the metal gate 250, a top of the semiconductor gate 222, a top of each memory cell 210, and a top of each semiconductor word line 220 are coplanar. As mentioned above, by modifying or adjusting parameters of the etching back process, the top of the semiconductor gate 222 and the tops of the semiconductor word lines 220 can be lower than the top of the metal gate 250 and the tops of the memory cells 210, though the bottom of the metal gate 250, the bottoms of the memory cells 210, the bottom of the semiconductor gate 222, and the bottoms of the semiconductor word lines 220 are coplanar.

According to the method for manufacturing the integrated circuit provided by the present invention, the semiconductor word lines and the semiconductor gate (serving as the erase gate) having the height smaller than the height of the dummy gate is provided. And the protecting layer can be formed on the semiconductor word lines and the semiconductor gate. Therefore, a height difference is caused between the dummy gate and the semiconductor word lines. Accordingly, the shorter semiconductor word lines are protected by the height difference and the protecting layer during removing the dummy gate. More important, the semiconductor word lines are protected without introducing any extra photomask. In other words, the integrated circuit structure and the method for forming the same provided by the present invention is to construct difference devices in the memory region and in the core region without increasing process complexity and difficulty, and thus improve semiconductor integration processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing an integrated circuit, comprising:
   providing a substrate comprising a memory region and a core region defined thereon;
   forming at least two semiconductor word lines, two memory cells and a semiconductor gate in the memory region, the memory cells being formed in between the two semiconductor word lines, the semiconductor gate being formed in between the two memory cells, and the semiconductor word lines comprising a first height;
   forming at least a transistor device in the core region, the transistor device comprising a dummy gate, and the dummy gate comprising a second height larger than the first height;

forming a protecting layer on the semiconductor word lines, the memory cells, the semiconductor gate and the transistor device;

removing a portion of the protecting layer to expose the dummy gate of the transistor device, wherein the semiconductor word lines and the semiconductor gate are still covered by the protecting layer;

removing the dummy gate to form a gate trench in the transistor device; and forming a metal gate in the gate trench.

2. The method for manufacturing an integrated circuit according to claim 1, further comprising:

forming the memory cells in the memory region;

forming a semiconductor layer on the substrate to fill up vacancies between the memory cells;

performing a planarization process to planarize the semiconductor layer such that a top surface of the semiconductor layer being coplanar with top surfaces of the memory cells; and performing an etching back process to etch back the semiconductor layer to form the semiconductor word lines, and the top surface of the semiconductor layer being lower than the top surfaces of the memory cells.

3. The method for manufacturing an integrated circuit according to claim 2, wherein the semiconductor layer comprise a first thickness before the etching back process and a second thickness after the etching back process, and a difference between the first thickness and the second thickness is between 170 angstroms (Å) and 250 Å.

4. The method for manufacturing an integrated circuit according to claim 2, wherein the memory cells comprise a third height after performing the etching back process, and the third height is larger than the first height.

5. The method for manufacturing an integrated circuit according to claim 4, wherein the third height is equal to the second height.

6. The method for manufacturing an integrated circuit according to claim 1, wherein the memory cells respectively comprise at least a floating gate and a patterned hard mask.

7. The method for manufacturing an integrated circuit according to claim 6, wherein the memory cells further comprise a control gate sandwiched in between the floating gate and the patterned hard mask, respectively.

8. The method for manufacturing an integrated circuit according to claim 1, wherein the step of forming the metal gate in the gate trench further comprise:

forming at least a work function metal layer and a filling metal layer in the gate trench sequentially; and removing superfluous work function metal layer and filling metal layer to form the metal gate.

9. The method for manufacturing an integrated circuit according to claim 8, further comprising a high-k gate dielectric layer formed in the gate trench, and the work function metal layer and the filling metal layer being formed on the high-k gate dielectric layer.

10. The method for manufacturing an integrated circuit according to claim 1, wherein the metal gate comprises a fourth height and the fourth height is larger or equal to the first height.

11. The method for manufacturing an integrated circuit according to claim 1, wherein the protecting layer comprises at least a contact etch stop layer (CESL).

* * * * *